(12) United States Patent
Ray et al.

(10) Patent No.: US 11,460,599 B2
(45) Date of Patent: Oct. 4, 2022

(54) SHIELDED-LOOP-RESONATOR BASED GRADIOMETER PROBE

(71) Applicant: RAYTHEON COMPANY, Waltham, MA (US)

(72) Inventors: William Martin Ray, Indianapolis, IN (US); Joseph J. Fraundorfer, Sterling, VA (US); Benjamin Dolgin, Sterling, VA (US)

(73) Assignee: Raytheon Company, Waltham, MA (US)

( * ) Notice: Subject to any disclaimer, the term of this patent is extended or adjusted under 35 U.S.C. 154(b) by 460 days.

(21) Appl. No.: 16/664,755

(22) Filed: Oct. 25, 2019

(65) Prior Publication Data
US 2020/0191988 A1    Jun. 18, 2020

Related U.S. Application Data

(60) Provisional application No. 62/780,870, filed on Dec. 17, 2018.

(51) Int. Cl.
| | | |
|---|---|---|
| *G01V 3/10* | (2006.01) | |
| *G01V 7/04* | (2006.01) | |
| *H03H 7/42* | (2006.01) | |
| *H01Q 7/00* | (2006.01) | |

(52) U.S. Cl.
CPC ............. *G01V 3/101* (2013.01); *G01V 7/04* (2013.01); *H01Q 7/00* (2013.01); *H03H 7/42* (2013.01)

(58) Field of Classification Search
CPC .......... G01V 3/101; G01V 7/04; G01V 3/104; H01Q 7/00; H01Q 7/005; H01Q 7/04; H03H 7/42; H04B 5/0081; G01R 33/022; G01R 33/0076; G01R 33/0023
See application file for complete search history.

(56) References Cited

U.S. PATENT DOCUMENTS

| | | | |
|---|---|---|---|
| 3,902,177 A | 8/1975 | Mori et al. | |
| 6,054,856 A | 4/2000 | Garroway et al. | |
| 7,973,722 B1 * | 7/2011 | Hill ........................... | H01Q 7/06 343/702 |
| 8,717,242 B2 | 5/2014 | Lavedas et al. | |
| 9,812,790 B2 | 11/2017 | Lavedas | |

(Continued)

FOREIGN PATENT DOCUMENTS

| | | |
|---|---|---|
| DE | 696 35 792 T2 | 10/2006 |
| KR | 101 339 015 B1 | 12/2013 |

OTHER PUBLICATIONS

Harpen, "The Theory of Shielded Loop Resonators," The Department of Radiology, University of South Alabama, Mobile, Alabama, accepted Aug. 25, 1994, MRM 32: pp. 785-788.

(Continued)

*Primary Examiner* — Daniel R Miller
(74) *Attorney, Agent, or Firm* — Lewis Roca Rothgerber Christie LLP (57) ABSTRACT

A noise cancelling gradiometer probe includes an insulating material having a first side and a second side; a first, second, third and fourth coaxial cables forming a first, second, third and fourth loops, respectively, where a portion of each of the first, second, third and fourth loops is locating on the first side of the insulating material and a portion of the first, second, third and fourth loops is locating on the second side of the insulating material.

11 Claims, 6 Drawing Sheets

(56) References Cited

U.S. PATENT DOCUMENTS

2006/0238430 A1* 10/2006 Morioka ................. H01Q 7/04
343/742
2014/0323046 A1   10/2014 Asai et al.
2015/0372395 A1   12/2015 Lavedas
2017/0207535 A1*   7/2017 Tsukuda ................. H01Q 1/24

OTHER PUBLICATIONS

Stensgaard, "Optimized Design of the Shielded-Loop Resonator," Danish Research Center of Magnetic Resonance, Hvidovre Hospital, Copenhagen, Denmark, received Feb. 12, 1996, Journal of Magnetic Resonance, Series A 122, Article No. 0187 (1996), pp. 120-125.

B.H. Suits et al., Noise-Immune Coil for Unshielded Magnetic Resonance Measurements, Chemistry Division, Naval Research Laboratory, Washington, D.C., received Aug. 25, 1997, Journal of Magnetic Resonance 131, Article No. MN971335 (1998), pp. 154-158.

International Search Report for corresponding International Application No. PCT/US2019/066988, filed Dec. 17, 2019, International Search Report dated Mar. 31, 2020 and mailed Apr. 14, 2020 (5 pgs.).

Written Opinion of the International Searching Authority for corresponding International Application No. PCT/US2019/066988, filed Dec. 17, 2019, Written Opinion of the International Searching Authority dated Apr. 14, 2020 (9 pgs.).

* cited by examiner

SHIELDED-LOOP-RESONATOR BASED GRADIOMETER PROBE

CROSS-REFERENCE TO RELATED APPLICATIONS

This Patent Application claims the benefits of U.S. Provisional Patent Application Ser. No. 62/780,870, filed on Dec. 17, 2018 and entitled "Shielded-Loop-Resonator Based Near-Filed Gradiometer Probe;" the entire contents of which are hereby expressly incorporated by reference.

FIELD OF THE INVENTION

The present invention relates generally to gradiometer probes, and more specifically to a shielded-loop-resonator based gradiometer probe that operates at distances comparable with the size of the probe.

BACKGROUND

A gradiometer measures the gradient (numerical rate of change) of a physical quantity, such as a magnetic field or gravity. When a plane radio frequency (RF) wave reaches a gradiometer, a zero reading is produced. However, when the front of the RF wave that reaches the gradiometer is curved, the value of the electrical field near the gradiometer is not constant and has a gradient. This causes the gradiometer to generate a signal that is proportional to the gradient.

A basic gradiometer includes two coils and a metrology circuit that measures the difference of the signals from the coils as a result of an electrical field near the coil. When a plane wave reaches these two coils, the coils produce identical signals and the difference will be zero and thus the gradiometer measures zero gradient. When the wave front is not planar, the signals are different and the resulting signal measurement is proportional to the gradient of the electrical field.

This gradiometer can operate only in the far field, which is the area where the distance between the source and the gradiometer is very large with respect to wavelength. If the source is near the gradiometer, the latter still measures some output but, since different parts of the gradiometer are exposed to very different areas of the field, the output is nearly impossible to relate to a gradient of the electric field. When the source is much closer to one part of the gradiometer than the other part, the signal from that part dominates the output and the gradient is not measured at all. Therefore, coil-based gradiometers do not work in the near field.

Moreover, the above-mentioned gradiometer does not explain the relationship between the wavelength of the radiation and the size of the gradiometer probe. While in many RF applications, the wavelength of the radiation is comparable or smaller than the size of the source and receiver antennas, in other applications the opposite is true, that is, the radiation wavelength is significantly greater than the size of the receiver antenna.

For the purposes of this disclosure, the far field is defined as the electromagnetic field at distances much greater than the distance from a receiver to the source. The near field is defined as the area in close proximity to the antenna, and is comparable in size with the size of the antenna. The source, or object to be detected, is placed in the near field region.

A major concern in systems that use near-field probes and related technologies, especially for detection and screening of materials such as explosives or nuclear material, is suppression of radio frequency interference (RFI). Suppression of RFI is particularly relevant for the systems, which rely on detection of a relatively weak or small signal. Detection of these weak or small signals, using near-field probe (antenna) systems such as loop antennas, can be difficult in the presence of strong far field noise sources/signals, such as AM radio transmitters, and nearby noise sources/signals, such as automobile ignitions, computers, mobile phones, and other electronics.

Figure 1:
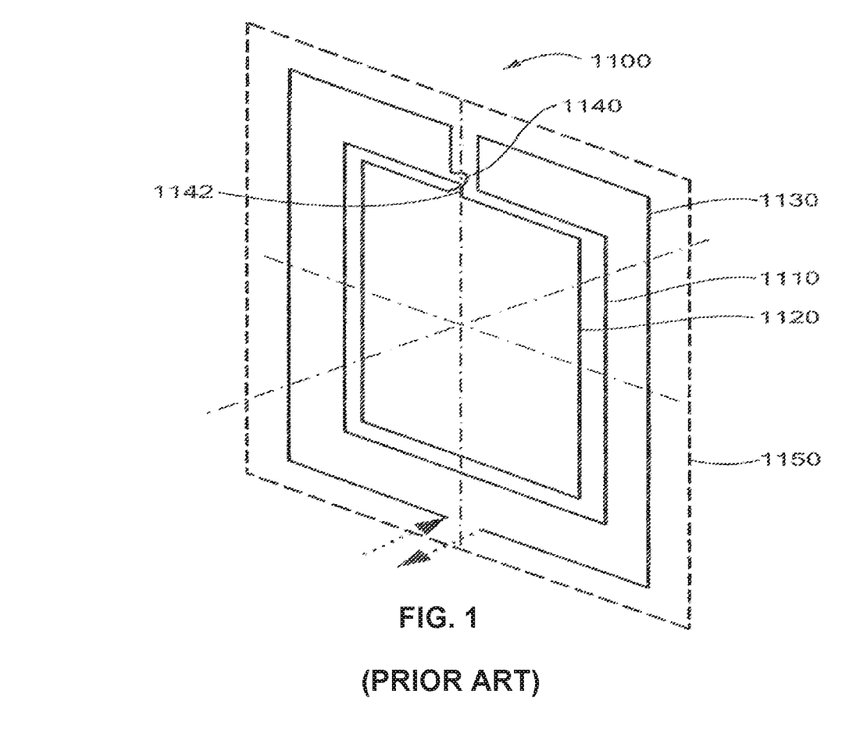
FIG. 1 shows a prior art antenna.

FIG. 1 shows a prior art antenna. As shown, antenna 1100 can be substantially flat, occupying a plane 1150. The antenna 1100 includes first loop 1110, a second loop 1120, and a third loop 1130 which are substantially coplanar in plane 1150. A coupler element 1142 supplies a current from the first loop 1110 to the second loop 1120. Coupler element 1140 juts out a distance from the plane 1150 to couple the third loop 1130 to the second loop 1120. The current flows in a first polarity through the third loop 1130, and in a second polarity opposite to the first polarity in first and second loops 1110, 1120. The loops 1110, 1120, and 1130 may be manufactured on a single side of an insulating material, such as a printed circuit panel or a panel, for ease of fabrication. The outer loop 1130 has an outer loop enclosed area equal in size to the sum of each of the inner loop enclosed areas. With this configuration, the far-field radiation is cancelled to a high degree, while the near-field energy is not as substantially impacted.

However, the bandwidth of this noise cancelling gradiometer probe (antenna) is limited by the self-resonance of the gradiometer probe. The sensitivity of the probe grows with the number of turns in the probe; however so does its inductance. A large inductance coupled with parasitic capacitance causes self-resonances to appear, rendering the probe less effective. In addition, introduction of objects (especially metals, cars, and the like) near the probe detunes the probe, again diminishing the effectiveness of the probe.

SUMMARY

Some embodiments are directed to a noise cancelling gradiometer probe utilizing a coaxial cable to form shielded loop resonator wires and a tuning circuit for tuning the probe. The shielded-loop-resonator based gradiometer probe operates at distances comparable with the size of the probe, operating as a gradiometer with respect to far away sources and as an antenna for near objects.

Some embodiments are directed to a gradiometer probe. In some embodiments, the probe includes: an insulating material having a first side and a second side; a first coaxial cable forming a first loop, wherein a portion of the first loop is locating on the first side of the insulating material and a second portion of the first loop is locating on the second side of the insulating material; a second coaxial cable forming a second loop, wherein a portion of the second loop is located on the first side of the insulating material and a second portion of the second loop is located on the second side of the insulating material; and a third coaxial cable forming a third loop, wherein a portion of the third loop is located on the first side of the insulating material and a second portion of the third loop is located on the second side of the insulating material. A first antenna is formed by the first portions of the first, second and third loops on the first side of the insulating material, and a second antenna is formed by the second portions of the first, second and third loops on the second side of the insulating material. The first antenna may act as a receive antenna and the second antenna may act as a transmit antenna.

Some embodiments are directed to a method of operating a gradiometer probe to detect a material. In some embodiments, the probe includes: connecting the gradiometer probe to a control box including a power supply; providing power to the gradiometer probe to transmit a transmit signal; tuning the gradiometer probe for detecting the material; and detecting a receive signal from excitation of the material to be detected by the transmit signal; analyzing the receive signal to detect the material. The gradiometer probe may include: an insulating material having a first side and a second side; a first coaxial cable forming a first loop, wherein a portion of the first loop is located on the first side of the insulating material and a second portion of the first loop is located on the second side of the insulating material; a second coaxial cable forming a second loop, wherein a portion of the second loop is located on the first side of the insulating material and a second portion of the second loop is locating on the second side of the insulating material; and a third coaxial cable forming a third loop, wherein a portion of the third loop is locating on the first side of the insulating material and a second portion of the third loop is locating on the second side of the insulating material. A first antenna is formed by the first portions of the first, second and third loops on the first side of the insulating material, and a second antenna is formed by the second portions of the first, second and third loops on the second side of the insulating material.

In some embodiments, the gradiometer probe further includes a tuning circuit, which may be a balun transformer. In some embodiments, the gradiometer probe further includes a fourth coaxial cable that forms a fifth loop larger than the fourth loop. In some embodiments, the gradiometer probe further includes an adjustment device to change an area of the third loop by expanding or contract the third loop outward or inward to tune the gradiometer probe.

BRIEF DESCRIPTION OF THE DRAWINGS

These and other features, aspects, and advantages of the present invention will become better understood with regard to the following description, appended claims, and accompanying drawings.

DETAILED DESCRIPTION

In some embodiments, the disclosed invention is a noise cancelling gradiometer probe which may be used, for example, for detection of near field objects using a coaxial cable to form shielded loop resonator wires. In some embodiments, both the core and the cladding of the coaxial cable are laid out in the same pattern, each of them separately forming a noise cancelling gradiometer. The coaxial cable forms the shielded loop resonator. This way, the probe has greater sensitivity and immunity from detuning from nearby objects, for example, in carry-on baggage (e.g. hair dryers, laptops) and therefore significantly improves object scanning performance.

Figure 2:
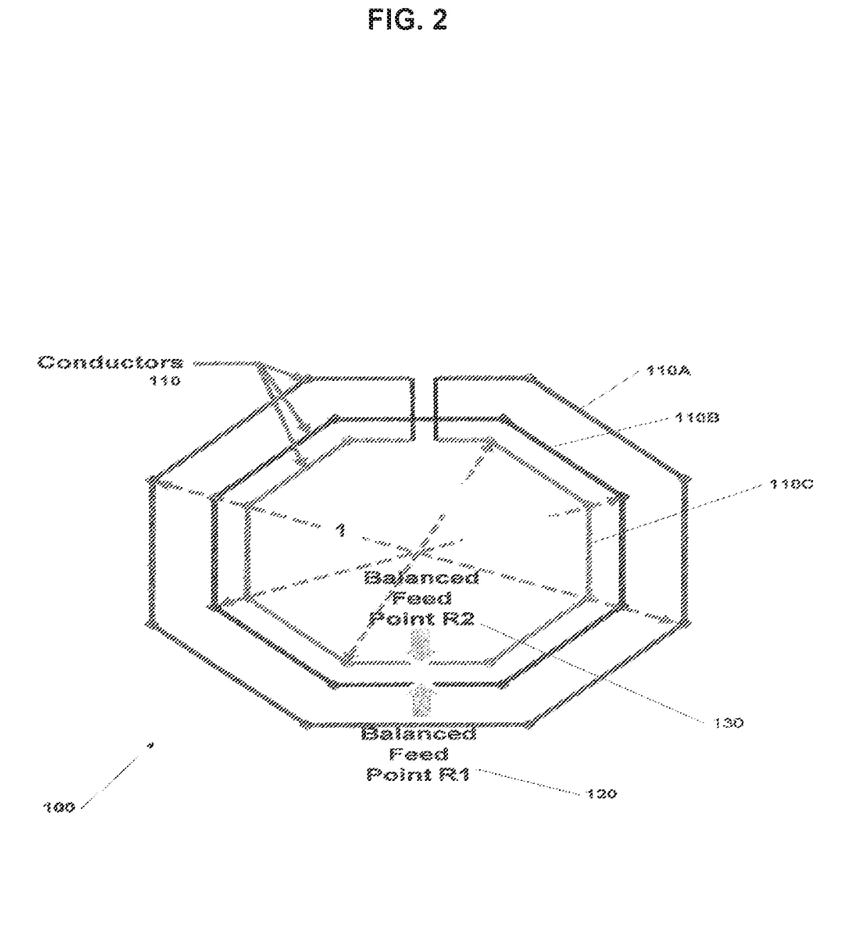
FIG. 2 illustrates an example of a geometric relationship of three coaxial cable antenna loops, according to some embodiments of the disclosed invention.

FIG. 2 illustrates an example of a geometric relationship of three coaxial cable antenna loops, according to some embodiments of the disclosed invention. As depicted, by applying a unique geometric relationship between a set of three or more coaxial cable loops (coils) such that one or more of the coaxial cable loops is magnetically isolated from the remaining coaxial cable loops, an electronic adjustment approach is achieved. Although FIG. 2 shows a geometric relationship of three loops of coaxial cables 110, one skilled in the art would recognize that the disclosed invention is not limited to three coaxial cable loops and other number of coaxial loops are within the scope of the invention. The arrangement of the coaxial cable loops includes an outer coaxial cable loop 110A (third loop), a middle coaxial cable loop 110B (second loop), and an inner coaxial cable loop 10C (first loop), as well as a first balanced feed point (port R1) 120 and a second balanced feed point (port R2) 130. Although the outer coaxial cable loop (coil) 110A, middle coaxial cable loop (coil) 110B, and inner coaxial cable loop (coil) 110C are substantially coplanar, there is electrical isolation between the first and second balanced feed points 120, 130, respectively. A more detailed description for the suppression of RFI is disclosed in U.S. Pat. No. 9,812,790, entitled "Near-field gradient probe for the suppression of radio interference," the entire content of which is hereby expressly incorporated by reference.

This way, coaxial cables, instead of solid conductors, are utilized to form a gradiometer probe, while the inner and outer conductors of the coaxial cable form a shielded loop resonator. The probe may then be placed in a panel, wall or equipment to detect objects, such as explosives, nuclear material, food, drugs and the like. The gradiometer probe may also be used in geological, archeological (measuring hidden anomalies in the ground), and/or medical applications to measure objects' (organs') depths, sizes and ages.

Figure 3A:
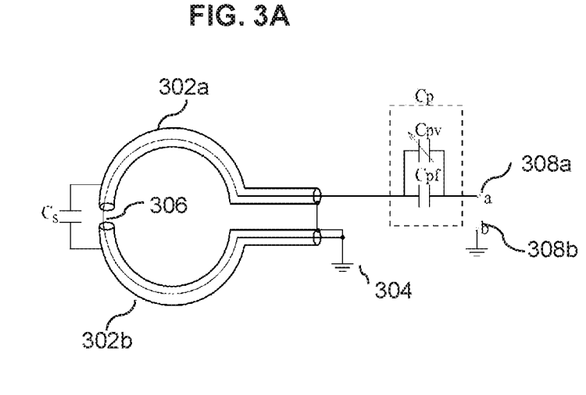
FIG. 3A shows an exemplary gradiometer probe including shielded wires, according to some embodiments of the disclosed invention.

FIG. 3A shows an exemplary shielded loop resonator, according to some embodiments of the disclosed invention. As shown, the gradiometer probe includes a loop of coaxial cables (302a and 302b), the two ends of which are connected to a common ground 304. A small gap 306 is formed between the loop of coaxial cables 302a and 302b, opposite to common ground 304. A first capacitor Cs is provided in parallel to the gap 306. A tune and match circuit Cp is connected to one end of the loop 308a. In some embodiments, the match circuit Cp may be modeled by a variable capacitor Cpv and capacitance Cpf. The probe is driven with unbalanced capacitors Cp and Cs.

One of the shortcomings of the conventional resonator is unstable tuning due to the presence of metallic objects nearby. Conventional gradiometer probes electrically couple the probe/antenna to a tuned circuit, resulting in a precisely tuned resonant frequency of the detector tuned circuit, but any movement of large conductive objects near the antenna can change the tuning of the detector. However, the shielded loop resonator (SLR) antenna illustrated in FIG. 3A, to a large degree, is insensitive to nearby metallic objects.

Figure 3B:
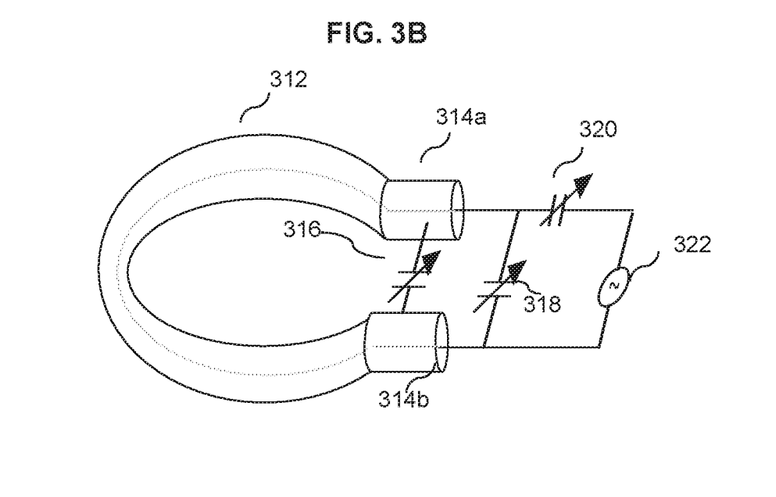
FIG. 3B shows an exemplary gradiometer probe including shielded loop resonator wires and a tuning circuit, according to some embodiments of the disclosed invention.

FIG. 3B shows an exemplary gradiometer probe including shielded loop resonator wires and a tuning circuit, according to some embodiments of the disclosed invention. As shown, two variable capacitors 316 and 318 are connected in parallel across the two ends (314a and 314b) of the coaxial cable loop 312. A power source 322, for example a current source, is also connected in parallel across the two ends (314a and 314b) of the cable loop 312. A third variable capacitor 320 is connected between the variable capacitor 318 and the power source 322. As depicted, the loops in FIGS. 3A and 3B are not arranged in the shape of the gradiometer.

These circuits, however, are unbalanced. In other words, if some power source induces a voltage between the ground and the loop 312, that signal would be delivered to an amplifier input 308a, which generates some noise, as a common mode noise. To get rid of this noise, a balanced to unbalanced (balun or isolation) transformer is used for the tuning circuit as illustrated in FIGS. 4A, and 4B.

Figure 4A:
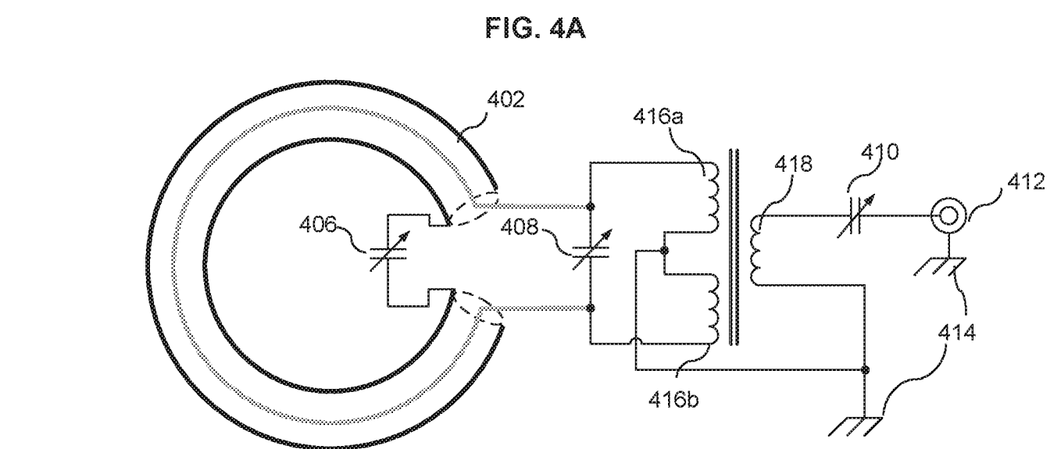
FIGS. 4A and 4B show an exemplary tuning circuit for a gradiometer probe, according to some embodiments of the disclosed invention.
Figure 4B:
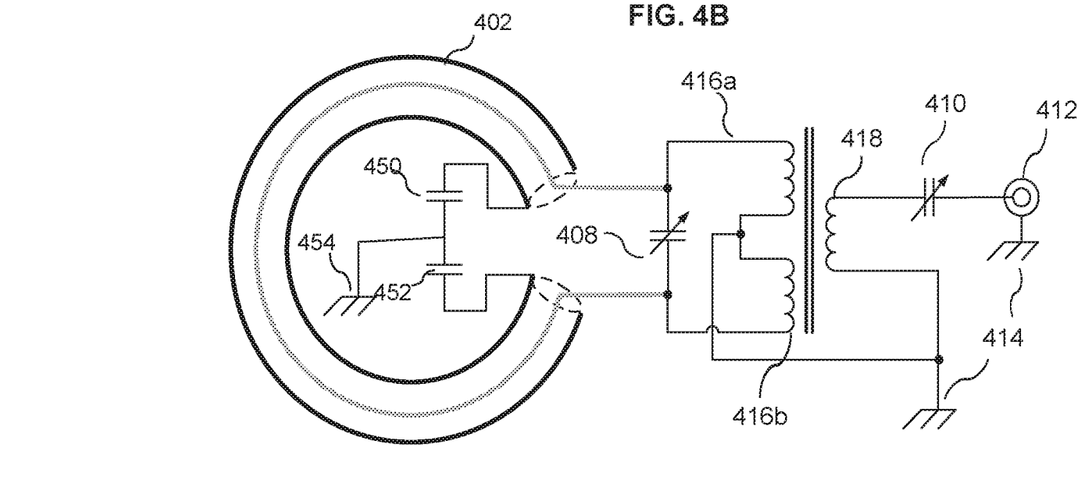

FIGS. 4A and 4B show exemplary tuning circuits for a gradiometer probe, according to some embodiments of the disclosed invention. FIG. 4A shows a balun transformer, including inductors 416a, 416b and 418 connected between the variable capacitors 408 and 410. Balun transformers are used to connect lines of differing impedance, typically using magnetic coupling. The electrically separate windings for input and output of a balun transformer allow them to connect circuits whose ground-level voltages are subject to ground loops or are otherwise electrically incompatible. The primary winding 418 receives the input signal 412, and the secondary winding (416a and 416b) outputs the converted signal to the coaxial cable loop 402.

The tuning circuit depicted in the embodiments of FIG. 4B, is similar to that shown in FIG. 4A, except that instead of the variable capacitor 406 in FIG. 4A, two capacitors 450 and 452 are connected in series, where their common terminals are connected to ground 454, which makes the tuner circuit more appropriate for receivers and low power transmitters. The value of the tuning circuit capacitors 408, 410, 450 and 452 are adjusted to achieve the desired resonant frequency of the gradiometer probe to tune the probe.

As shown, the loops in FIGS. 4A and 4B are now arranged in the shape of the gradiometer. For example, the balanced probe 402 is coupled to the unbalanced input of an amplifier 412, and common mode current is minimized.

Figure 5A:
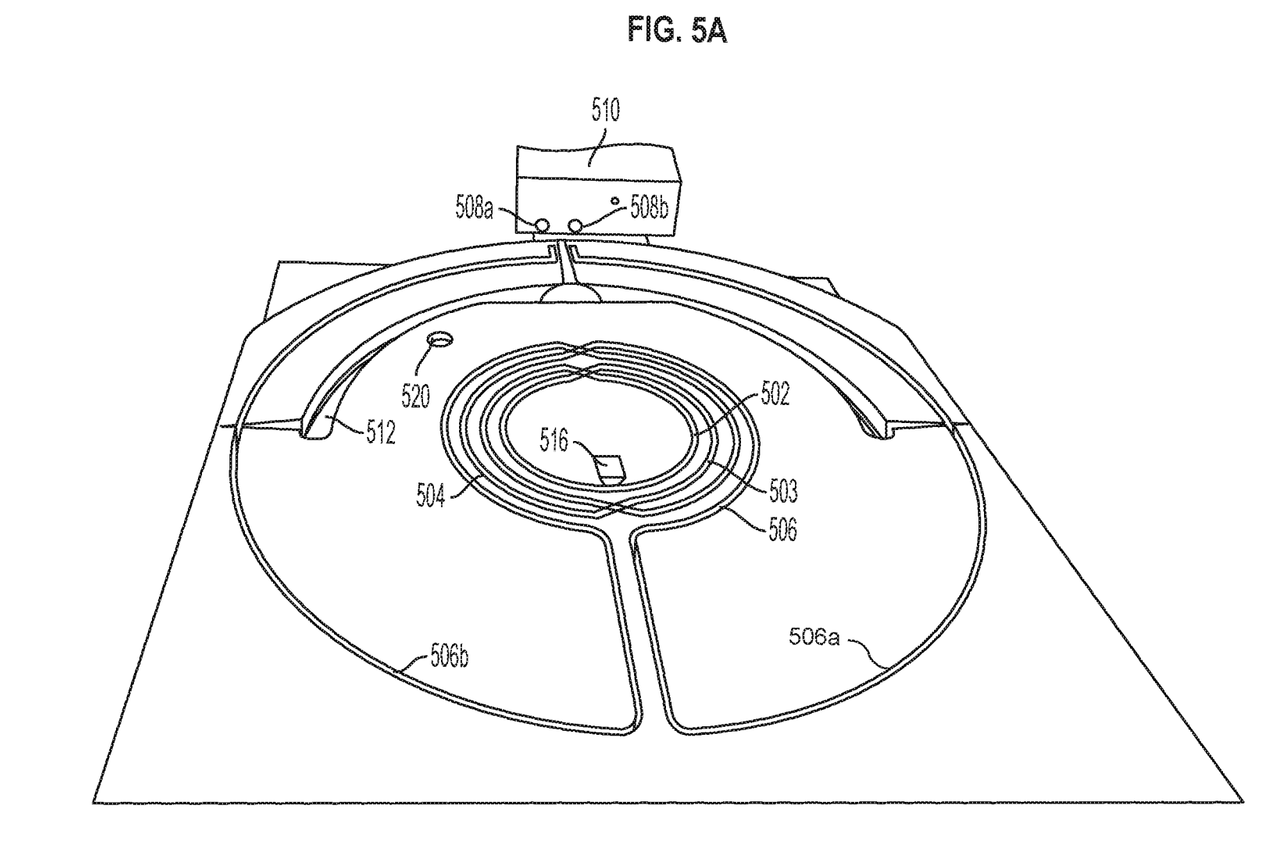
FIG. 5A depicts an exemplary gradiometer probe, according to some embodiments of the disclosed invention.

FIG. 5A depicts an exemplary gradiometer probe, according to some embodiments of the disclosed invention. In some embodiments, the various configurations of the coaxial cable coils makes the gradiometer probe capable of operating at distances comparable with the size of the probe, and operating as a gradiometer with respect to far away sources and as a conventional antenna for near objects. As shown in this example, the gradiometer probe includes a shielded coaxial cable that forms first, second, third and fourth coils (loops) 502, 503, 504 and 506, respectively, where each shielded coaxial cable coil includes a respective loop area and is spaced apart from the other antenna loops. In some embodiments, coil 506 is equivalent to coil 110a and coils 502, 503 and 504 are equivalent to coils 110b and 110c, in FIG. 2.

There may be another four coaxial cable coils underneath the four that are visible. For example, each coaxial cable coil 502, 503, 504 and 506 may form a two layer, interleaved eight-turn coil, where some portion of each coaxial cable coil is in the bottom layer of an insulating material while the rest of the coil is located on the top layer of the insulating material, as shown in FIG. 5A. The total area of coaxial cable coils 502, 503, 504 is equal to the total area of the coil 506. Although, only four coaxial cable coils 502, 503, 504 and 506 are shown in FIG. 5A for clarity, there are four additional coaxial cable coils in the bottom layer. However, the embodiments of the disclosed invention are not limited to eight coils and may have different number of coils.

In some embodiments, coaxial cable coil 506 is extended through a larger outer loop 506b, as shown. The two ends 508a and 508b of the larger loop 506b may be connected to the ports of a control box 510 that may include a spectrum analyzer, tuning circuit, processor and power supply to capture, process and analyze a signal received by the excitation of the material to be detected. In some embodiments, a capacitance 516, which may include one or more resonating capacitors, is used to tune the probe.

Electrically, each coaxial cable coil 502, 503, 504 and 506 forms a two layer, interleaved n-turn coil on each side of an insulating material. In this case, n is four loops, however, any other number of coils (loops), for example, three, five, six and the like, are within the scope of the invention. In some embodiments, areas 514a and 514b are where the coaxial cable coils (502, 503, 504 and 506) in the two layers of the insulating material (e.g., a top layer and a bottom layer) are interleaved, i.e., changed from one coil (an outer coil or an inner coil) to another coil (an inner coil or outer coil), and from one layer to the other layer. For example, outer coaxial cable coil 506b (extending from port 508a) may be on the top layer (side) of the insulating material to the left of area 514a and then at area 514a coil 506b is bent to be located at the bottom layer and formed as the inner coil 504 at the bottom layer to the right of FIG. 5A. Coil 504 (at the bottom layer) then transitions up to the top layer at area 514b and forms inner coil 503 (to the left of FIG. 5A). Coil 503 (at the top layer) then transitions down to the bottom layer at area 514a and forms the inner coil 502 (to the right of FIG. 5A).

The coaxial cable then starts to "unwind" and form the outer loops. Inner coil 502 (at the bottom layer) loops around and transitions up to the top layer at area 514a and forms an outer coil 503 (to the right of FIG. 5A). The outer coil 503 (now at the top layer) transitions down to the bottom layer at area 514b and forms an outer coil 504 (to the left of FIG. 5A). The outer coil 504 (now at the bottom layer) transitions up to the top layer at area 514a and forms outer coil 506 (to the right of FIG. 5A). The outer coil 506 (now at the top layer) then forms the outer loop 506a and connects to port 508b. In some embodiments, brackets 518a and 518b secure the top layer coaxial cable coils to the insulating material.

In some embodiments, an adjustment device 512, for example, a wedge shaped non-conductive material, is mechanically used to change the area of the coil 506 by expanding or contract the coil 506 outward or inward, in order to tune the gradiometer probe. For example, when the two ends of the adjustment device 512 (that are mechanically connected to the outer coil 516b) are pulled in, they pull in the outer coil 506b inward and thus reducing the area under it. There may be various types of stoppers, latches or groves beneath the adjustment device 512 that secures its newly formed to a platform and thus keeps the newly shaped form of the outer coil 506b. In some embodiments where the gradiometer probe includes only three coils, the adjustment device is mechanically used to change the area of the third (outer) coil by expanding or contract the third coil outward or inward, in order to tune the gradiometer probe.

In some embodiments, in an operating mode, control box 510 is connected to the ports 508a and 508b and the capacitance 516 is shorted to tune the gradiometer, as opposed to tuning the antenna. The geometry of the coil 506b then changed by the adjustment device 512, as explained above, to tune the gradiometer probe and thus minimize the signal that the spectrum analyzer views.

The tuning capacitance 516 is reconnected and the tuning circuit is then tuned so that the resonant frequency of the gradiometer probe is at the desired detection frequency for the object to be detected. As explained above, the desired detection frequency depends on the objects and/or material to be detected by the gradiometer probe.

In some embodiments, the coaxial cable coils 502, 503, 504 and 506 on the top layer operate as a receiver antenna, and as a transmitter antenna on the bottom layer underneath the receiver antennas, which is tuned using adjustment nobs 520. In some embodiments, the coaxial cable coils 502, 503, 504 and 506 may be manufactured on two sides of an insulating material, such as a printed circuit board or a panel, for ease of fabrication. In some embodiments, the portions of the coaxial cable coils 502, 503, 504 and 506 on the top layer form the receiver antenna, and the portions of the coaxial cable coils 502, 503, 504 and 506 on the bottom layer form the transmitter antenna. In operation, the transmitter antenna transmits a signal, for example, a pulse (e.g., to excite the material whose detection is desired) and the receiver antenna waits to detect a signal caused by the excitation of the material to be detected as a result of the transmitted pulse.

Figure 5B:
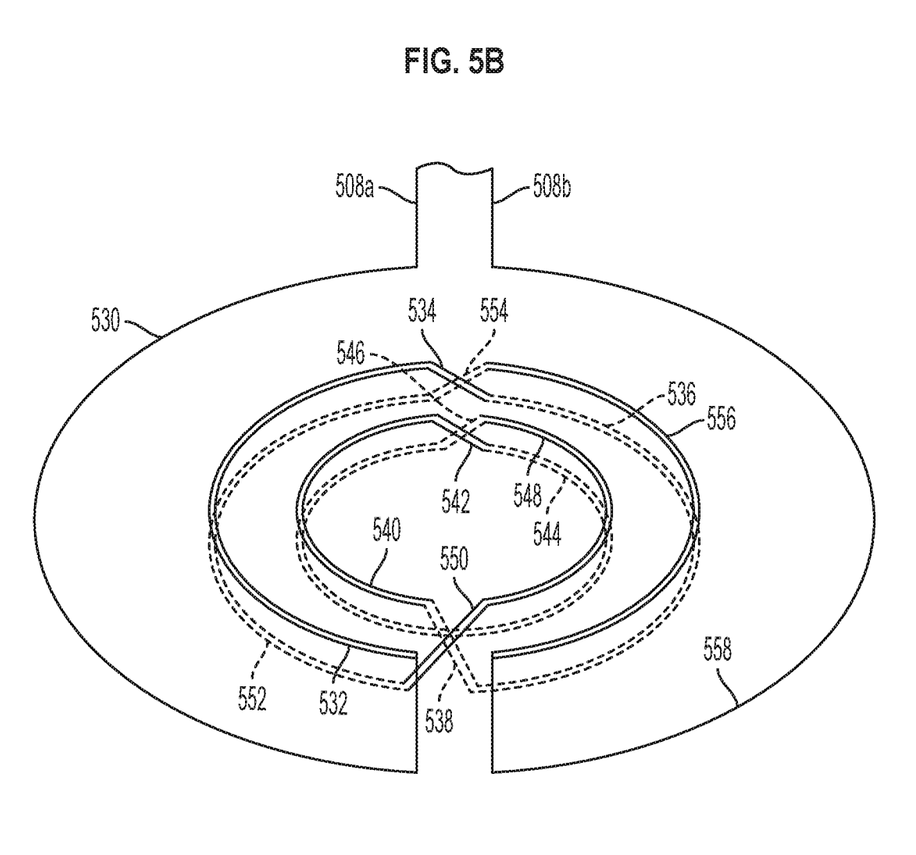
FIG. 5B illustrates an exemplary gradiometer probe with three coils, according to some embodiments of the disclosed invention.

FIG. 5B illustrates an exemplary gradiometer probe with three coaxial cable coils, according to some embodiments of the disclosed invention. As shown, there are three coaxial cable coils (loops) (530 and 558, 532 and 556; and 540 and 548) on a first side of an insulating material (e.g., top layer), which are shown by solid lines. There are also three coaxial cable coils (loops) (552, 536 and 544) on a second side of the insulating material (e.g., bottom layer), which are shown by dashed lines.

A coaxial cable forming coil 530, which is connected to the port 508a of the control box 510 (not shown in this figure) forms another loop 532 on the first (e.g., top) side of the insulating material and then transitions (at point 534) to the other (e.g., bottom) side of the insulating material as the bottom layer inner coil 536. Coil 536 then transitions up to the top layer at point 538 forming the inner coil 540 at the top layer. Coil 540 at the top layer transitions down to the bottom layer at point 542 forming an inner coil 544 at the bottom layer, which loops around at the bottom layer and transitions up to the top layer at point 546 forming an outer coil 548. Coil 548 at the top layer then transition down to the bottom layer at point 550 forming an outer coil 552. Coil 552 at the bottom layer then transitions up to the top layer at point 554 forming the outer coil 556 at the top layer, which then forms outer coil 558 at the top layer. Coaxial cable coil 558 at the top layer (which is part of the same coaxial cable 530 connected to port 508a) then connects to port 508b.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims and drawings.

What is claimed is:

1. A gradiometer probe comprising:
   an insulating material having a first side and a second side
   a first coaxial cable forming a first loop, wherein a portion of the first loop is located on the first side of the insulating material and a second portion of the first loop is located on the second side of the insulating material;
   a second coaxial cable forming a second loop, wherein a portion of the second loop is located on the first side of the insulating material and a second portion of the second loop is locating on the second side of the insulating material;
   a third coaxial cable forming a third loop, wherein a portion of the third loop is locating on the first side of the insulating material and a second portion of the third loop is locating on the second side of the insulating material, wherein
   a first antenna is formed by the first portions of the first, second and third loops on the first side of the insulating material, and a second antenna is formed by the second portions of the first, second and third loops on the second side of the insulating material; and
   a fourth coaxial cable forming a fourth loop, wherein a portion of the fourth loop is located on the first side of the insulating material and a second portion of the fourth loop is located on the second side of the insulating material, and wherein the fourth coaxial cable further forms a fifth loop larger than the fourth loop.

2. The gradiometer probe of claim 1, further comprising a tuning circuit.

3. The gradiometer probe of claim 2, wherein the tuning circuit is a balun transformer.

4. The gradiometer probe of claim 1, further comprising an adjustment device to change an area of the third loop by expanding or contracting the third loop outward or inward to tune the gradiometer probe.

5. The gradiometer probe of claim 1, wherein the first antenna is a receive antenna and the second antenna is a transmit antenna.

6. The gradiometer probe of claim 1, wherein the first, second and third coaxial cables are part of the same coaxial cable.

7. A gradiometer probe comprising:
   an insulating material having a first side and a second side
   a first coaxial cable forming a first loop, wherein a portion of the first loop is located on the first side of the insulating material and a second portion of the first loop is located on the second side of the insulating material;
   a second coaxial cable forming a second loop, wherein a portion of the second loop is located on the first side of the insulating material and a second portion of the second loop is locating on the second side of the insulating material;
   a third coaxial cable forming a third loop, wherein a portion of the third loop is locating on the first side of the insulating material and a second portion of the third loop is locating on the second side of the insulating material, and wherein a first antenna is formed by the first portions of the first, second and third loops on the first side of the insulating material, and a second antenna is formed by the second portions of the first, second and third loops on the second side of the insulating material; and
   an adjustment device to change an area of the third loop by expanding or contracting the third loop outward or inward to tune the gradiometer probe, wherein the adjustment device is a wedge shaped non-conductive material to mechanically move to change the area of the third loop.

8. A method of operating a gradiometer probe to detect a material, the method comprising:
connecting the gradiometer probe to a control box including a power supply;
providing power to the gradiometer probe to transmit a transmit signal;
tuning the gradiometer probe for detecting the material; and
detecting a receive signal from excitation of the material to be detected by the transmit signal;
analyzing the receive signal to detect the material, wherein the gradiometer probe comprises:
an insulating material having a first side and a second side;
a first coaxial cable forming a first loop, wherein a portion of the first loop is located on the first side of the insulating material and a second portion of the first loop is located on the second side of the insulating material;
a second coaxial cable forming a second loop, wherein a portion of the second loop is located on the first side of the insulating material and a second portion of the second loop is locating on the second side of the insulating material;
a third coaxial cable forming a third loop, wherein a portion of the third loop is locating on the first side of the insulating material and a second portion of the third loop is locating on the second side of the insulating material, and wherein
a first antenna is formed by the first portions of the first, second and third loops on the first side of the insulating material, and a second antenna is formed by the second portions of the first, second and third loops on the second side of the insulating material; and
a fourth coaxial cable forming a fourth loop, wherein a portion of the fourth loop is located on the first side of the insulating material and a second portion of the fourth loop is located on the second side of the insulating material, and
wherein the fourth coaxial cable further forms a fifth loop larger than the fourth loop.

9. The method of claim 8, wherein the tuning is performed by a balun transformer.

10. The method of claim 8, wherein the first antenna is a receive antenna and the second antenna is a transmit antenna.

11. A method of operating a gradiometer probe to detect a material, the method comprising:
connecting the gradiometer probe to a control box including a power supply;
providing power to the gradiometer probe to transmit a transmit signal;
tuning the gradiometer probe for detecting the material; and
detecting a receive signal from excitation of the material to be detected by the transmit signal;
analyzing the receive signal to detect the material, wherein the gradiometer probe comprises:
an insulating material having a first side and a second side;
a first coaxial cable forming a first loop, wherein a portion of the first loop is located on the first side of the insulating material and a second portion of the first loop is located on the second side of the insulating material;
a second coaxial cable forming a second loop, wherein a portion of the second loop is located on the first side of the insulating material and a second portion of the second loop is locating on the second side of the insulating material;
a third coaxial cable forming a third loop, wherein a portion of the third loop is locating on the first side of the insulating material and a second portion of the third loop is locating on the second side of the insulating material, wherein
a first antenna is formed by the first portions of the first, second and third loops on the first side of the insulating material, and a second antenna is formed by the second portions of the first, second and third loops on the second side of the insulating material; and
an adjustment device to change an area of the third loop by expanding or contracting the third loop outward or inward to tune the gradiometer probe, wherein
the adjustment device is a wedge shaped non-conductive material to mechanically move to change the area of the third loop.

* * * * *